(12) United States Patent
Chuang et al.

(10) Patent No.: US 6,291,814 B1
(45) Date of Patent: Sep. 18, 2001

(54) SLIT VALVE WITH SAFETY DETECT DEVICE

(75) Inventors: P. C. Chuang, Hsinchu; Tsung-Lin Lu, TaiNan; Gary Kuan; Hunter Chuang, both of Hsinchu, all of (TW)

(73) Assignee: Utek Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/325,842

(22) Filed: Jun. 4, 1999

(51) Int. Cl.[7] .................................................. H01J 40/14
(52) U.S. Cl. .............................. 250/221; 250/559.4
(58) Field of Search ................... 250/221, 222.1, 250/223 R, 559.33, 559.29, 559.36, 559.4; 414/221, 935, 937, 939, 940; 251/193, 149, 149.3

(56) References Cited

U.S. PATENT DOCUMENTS 5,579,718 * 12/1996 Freerks .................................. 118/733

* cited by examiner

*Primary Examiner*—Que T. Le
(74) *Attorney, Agent, or Firm*—Dougherty & Troxell

(57) ABSTRACT

A slit valve with safety detect device to prevent clipping, used to reduce the wafer damaged by the slit valve of the seal plate, further to have the function of the safety interlock and cost down the production. This invention mainly includes a plurality of sensor to detect that whether something in the range of the seal plate moving or not. The sensor consisted of an emitter and a receiver for detecting. If there are something in the range, the moving seal plate will stop moving, avoid the wafer damaged by the seal plate and to cost down.

15 Claims, 6 Drawing Sheets

SLIT VALVE WITH SAFETY DETECT DEVICE

BACKGROUND OF THE INVENTION

1. Field of the Invention

The present invention relates to a slit valve with safety detect device to prevent clipping. More particularly, it relates to a safety detect device including a plurality of sensor to detect whether there are anything in the route that the seal plate moving.

2. Background of the Invention

There are many slit valves established between the plurality of different reaction chambers. The slit valves are used to act as the doors for the waiting processing wafer or processed wafer in/out the different chamber. The position of the slit valves in the prior art shown in FIG. 1. There includes a transfer chamber 1 used to transfer the wafer from one chamber to another chamber. A load-lock chamber 3 placed beside the transfer chamber 1 to load the wafer and lock. There also includes a processing chamber 2 posited beside the other side of the transfer chamber 1. The process chamber 2 is used to deal with the wafer, for example, etching, iron implanting or depositing the wafer. In FIG. 1, there are two slit valves 13, one is posited between the transfer chamber 1 and the load lock chamber 3, the other slit valves is posited between the transfer chamber 1 and the process chamber 2.

The conventional slit valves can not detect that there are something between the range of the seal plate moving, because there is not any safety sensor with the conventional slit valves. If there is a wafer or robot blade in the range of the seal plate moving, the wafer or robot will be clamped and damaged. There are many wafer damaged cases by the slit valves in many semiconductor companies. FIG. 2 shows the prior art of the slit valve comprising a clean dry air 30 used to push a seal plate 35 of a slit valve 25. The seal plate 35 is sealed up with a slit 20. The slit 20 is placed in the edge 10 of the transfer chamber and the edges 20a, 20b of the slit 20 is an inclined plane as shown in FIG. 2. The seal plate 35 is in the top of the slit valve 25 and sealed up with a slit 20, so the interval between the transfer chamber 1 and the processing chamber 2 can be sealed up.

FIG. 2 shows the wafer 40 is placed on a robot blade 45 and be transferred into a chamber through the slit 20. When the wafer 40 is on the way into the slit 20 and the slit valve 25 wants to seal up with the slit 20, then the wafer 40 will be clamped and damaged by the seal plate 35 of the slit valve 25. The technique shown in FIG. 2 exposes that there is not any safety detector on the slit valve or slit, that's why the wafer 40 always be damaged by the seal plate 35. This kind of the wafer damaged cases are too numerous to be counted in several semiconductor companies. It should adds the safety sensor on the slit valve to avoid the damage.

SUMMARY OF THE INVENTION

The present invention relates to a slit valve with safety detect device to prevent clipping, which efficiently decrease the wafer damaged by the slit valve. The safety detect device use the different kind of transmit medium, light, infrared rays, ultra sonic, magnetism and the approximate switch to detect that there are something in the range of the seal plate moving or not. So this invention can achieve the target of the safety interlock function and to decrease the wafer damaged.

That is, the primary object of the present invention is to provide slit valve with safety detect device to achieve the safety interlock function. Further, the other object of the present invention is to provide slit valve to reduce the wafer damaged by the seal plate of the slit valve.

In order to achieve the purpose described above, we use two pair of the emitter/receiver mounted on the seal plate and the slit. The emitter and the receiver can detect that whether there are something in the range of the seal plate moving.

For the preferred embodiment, the emitter and the receiver further use the light, infrared rays, ultra sonic, magnetism and the approximate switch to act as the transmitted medium. That is the switch can set up in different type. Furthermore, this invention can be applied to different type of the slit valve by adding the safety sensor.

BRIEF DESCRIPTION OF THE DRAWINGS

The foregoing features of the present invention may be more fully understood from the following detailed description, read in conjunction with the accompanying drawings, wherein.

DETAILED DESCRIPTION OF THE PREFERRED EMBODIMENT

This invention provides a slit valve with safety detect device to prevent clipping, especially about to a safety detect device including a plurality of sensor to detect whether there are anything in the route that the seal plate moving. So this invention can achieve the purpose of the safety interlock function.

Figure 1:
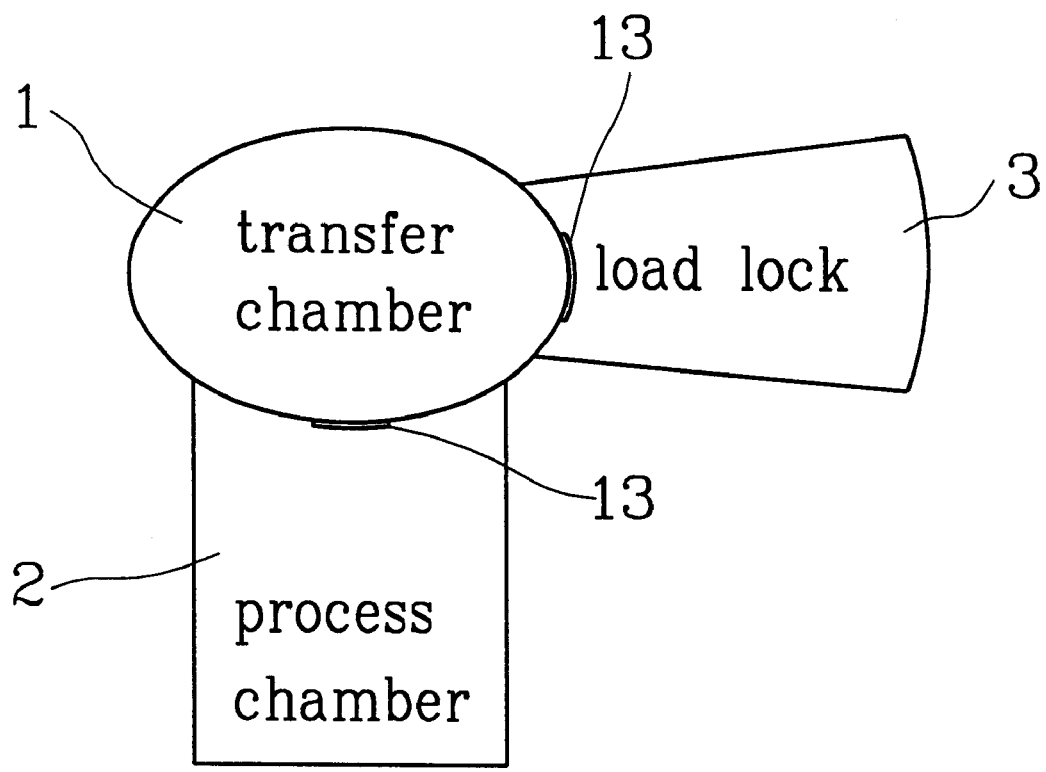
FIG. 1 is a schematic illustration of the prior art of the slit valve placed position.
Figure 2:
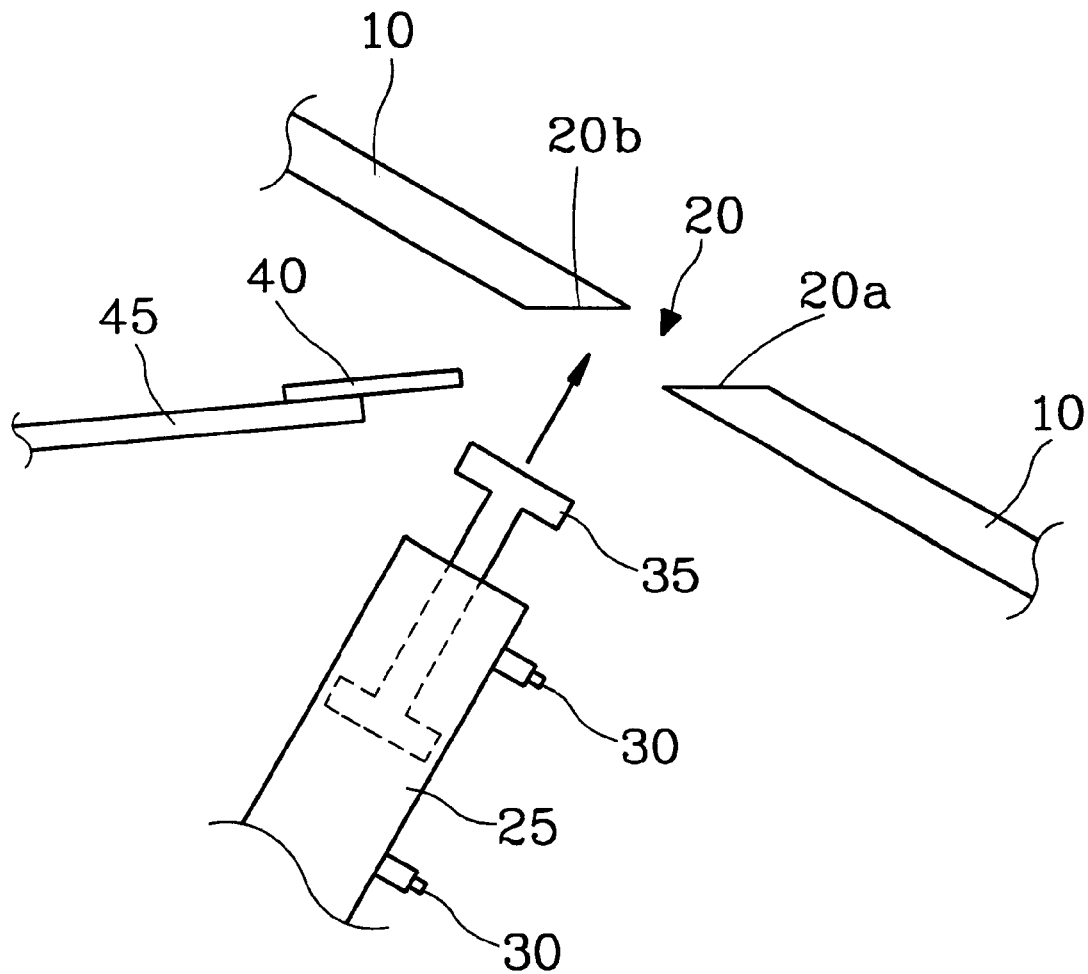
FIG. 2 is a schematic illustration of the prior art of the clean dry air to push the sea late to seal up with the slit.
Figure 3:
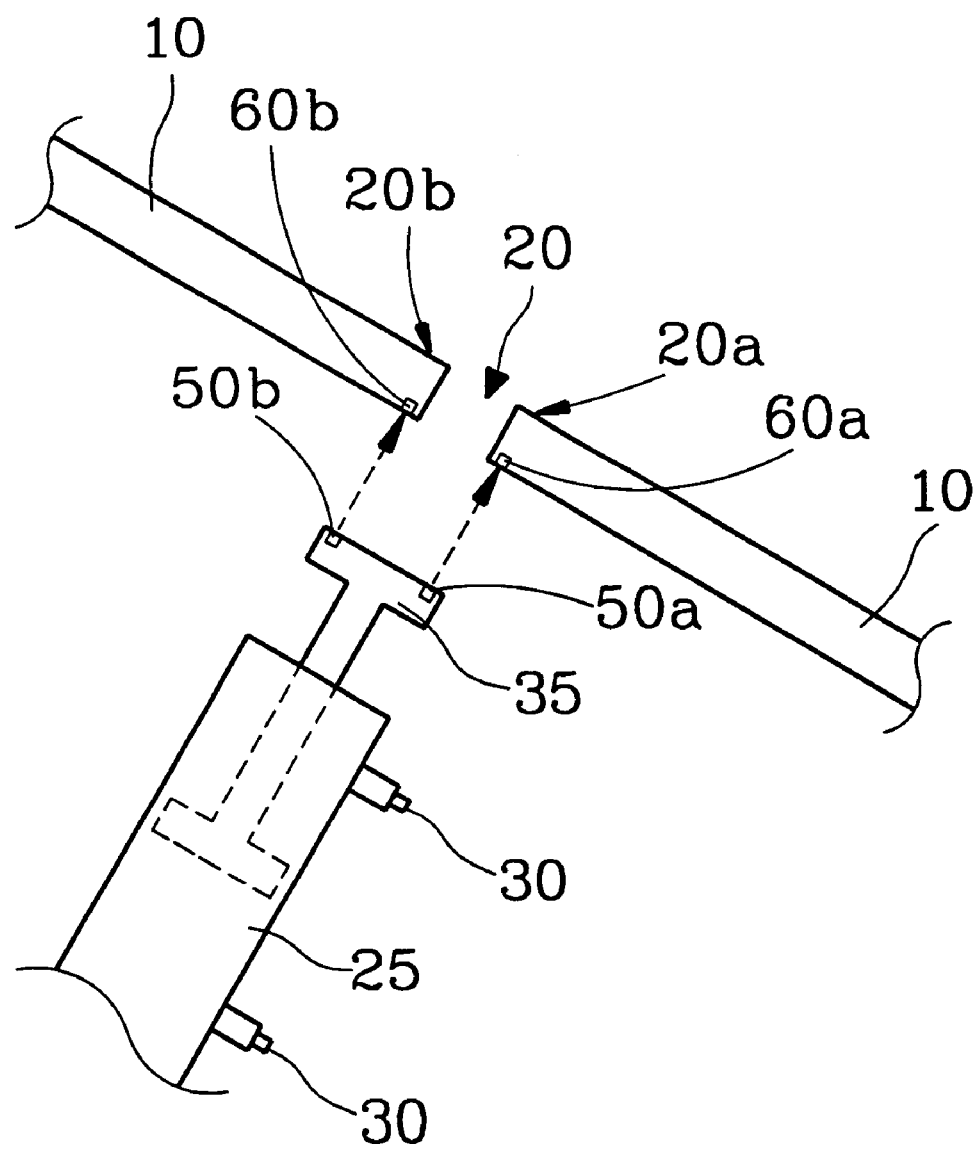
FIG. 3 is a schematic illustration of the first embodiment according to the present invention.

Please referring to FIG. 3, there is shown the first embodiment of this invention. The most different between the FIG. 2 and FIG. 3 is that the FIG. 3 further comprising two pair of the safety sensor. Each one safety sensor is established by a emitter 50 and a receiver 60. There are first and second emitters 50a, 50b mounted on the two ends of the seal plate 35. The first and the second receivers 60a, 60b placed on the two ends 20a, 20b of the clean dry air (CDA) 30 is used to push the seal plate 35 of the slit valve 25 seal up with the slit 20.

Figure 4:
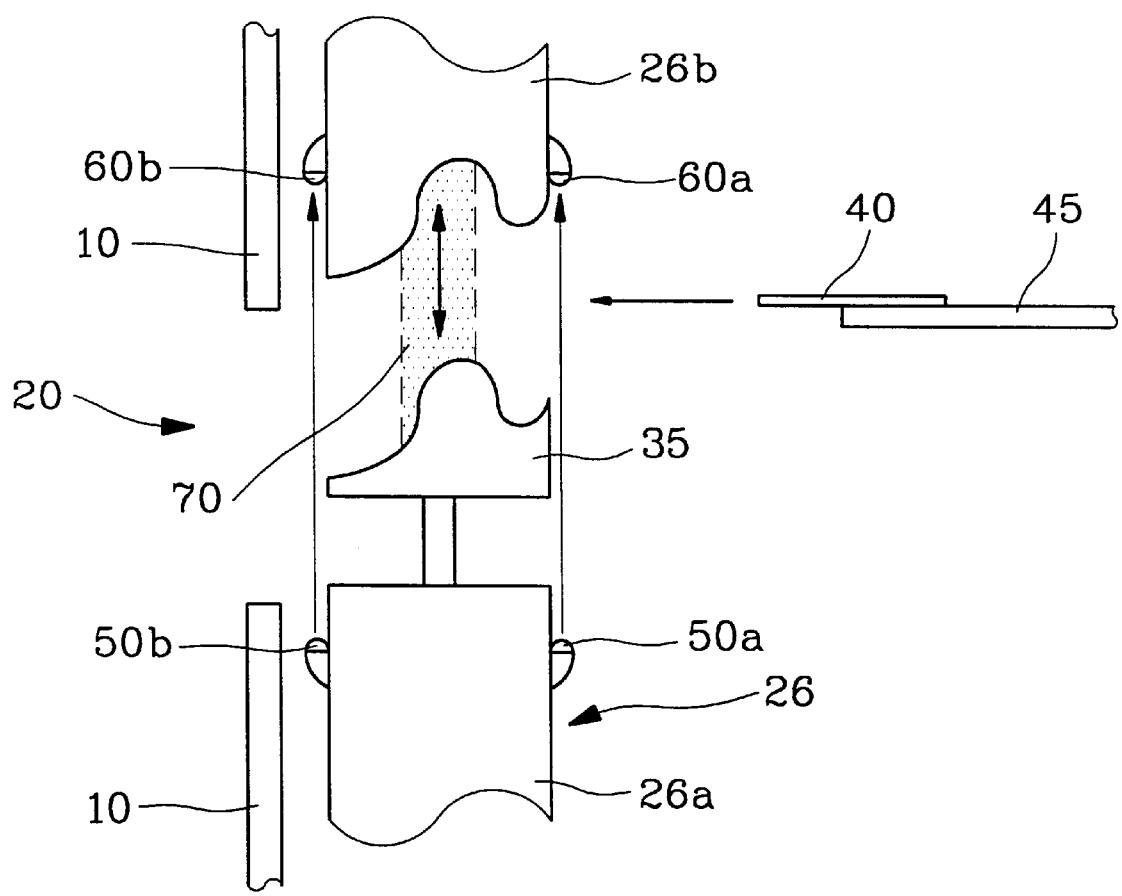
FIG. 4 is a schematic illustration of the second embodiment according to the present invention.

When the wafer 40 is sent into the chamber through the slit 20, the emitters 50a, 50b emitting the light or infrared rays signal to the receivers 60a, 60b to detect that whether there is anything between the range of the seal plate 35 moving. If the receiver 60a, 60b detect something in the range, then the main controller will stop the seal plate 35 moving. By the way, the main controller is not the main point we want to disclose, it maybe use a computer to control the action, it does not show in FIG. 3. The receiver 60a, 60b detect something in the range by reading the emitting signal from the emitter 50a, 50b. If the emitting signal is discontinuous, then it means that there are something (wafer or robot blade) in the range. In this moment, the moving seal plate 35 will be stop to avoid the seal plate 35 clamp the wafer or damage it. FIG. 4 shows the second embodiment of this invention. It shows the different type of the slit valve. The seal plate 35 is placed in the center of the second slit valve 26. The emitter 50 and receiver 60 are mounted in the two ends 26a, 26b of the second slit valve 26. The numeral 70 represents the range of the seal plate 35 moving. As shown in the second embodiment, there are also the first and second emitters 50a, 50b to constitute the emitter 50. The first and second receivers 60a, 60b are to constitute the receiver 60. In the second embodiment, the second slit valve 26 distinguish as two part and the seal plate 35 moves to seal up the two part of the second slit valve 26. By the second embodiment, if there are something in the range 70, the emitter 50 and receiver 60 will produce a signal to a main controller (not shown in FIG. 4) and stop the seal plate 35, further, the seal plate 35 will back to original position. So the second embodiment can avoids the wafer 40 damaged by the seal plate 35 and completes the safety interlock function.

Figure 5:
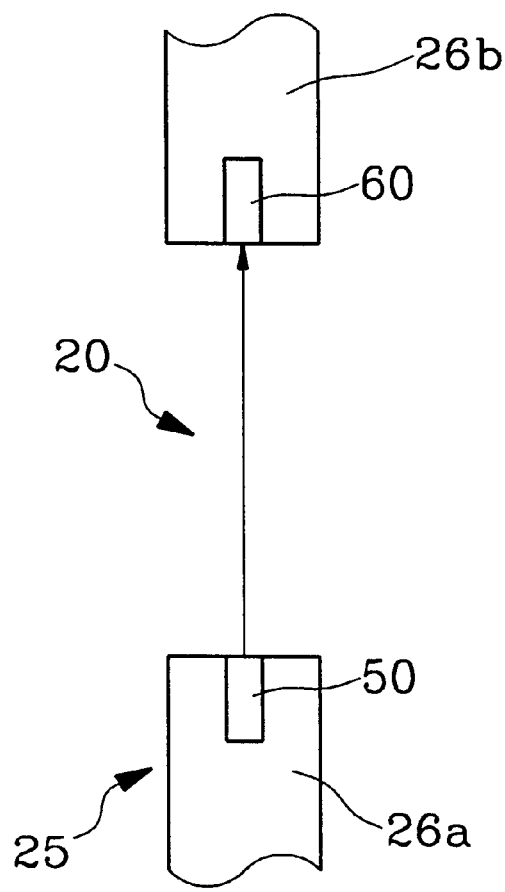
FIG. 5 is a schematic illustration of the third embodiment according to the present invention.

The schematic illustration of the third embodiment is shown in FIG. 5. It is mainly to show that the different sensor device type. The sensor includes only one emitter 50 and one receiver 60, it's different from the second embodiment. The slit valve 25 has two part 26a, 26 i bto place the in FIG. 5) moving safely by the sensor (means the emitter 50 and the receiver 60). The wafer into the slit 20 of the third embodiment will be safety and the cost of wafers damaged will be decreased.

Figure 6:
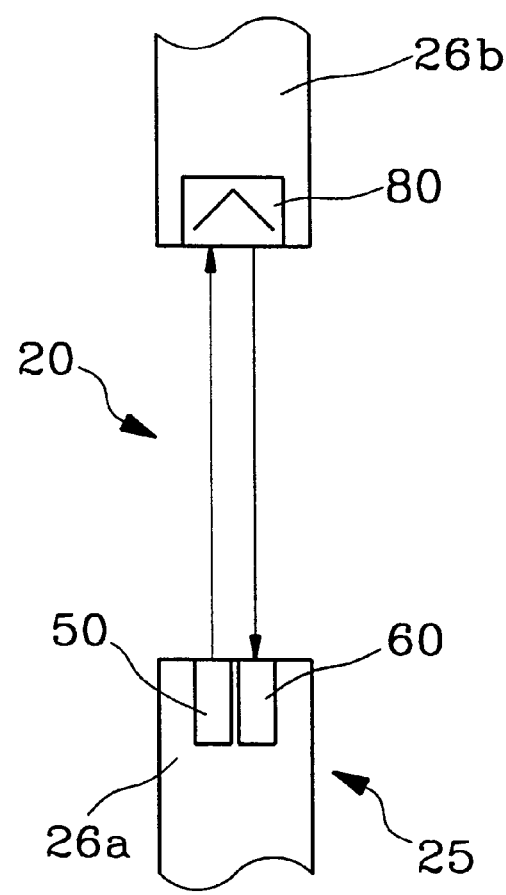
FIG. 6 is a schematic illustration of the fourth embodiment according to the present invention.

The another devising type of the emitter 50 and receiver 60 as the and FIG. 6 is that the emitter 50 and receiver 60 placed in the same end 26a of the slit valve 25. Further, there is a reflector 80 placed on the other end 26b of the slit valve 25. The signal emitted from the emitter 50 is transmitted to the reflector 80, then reflected to the receiver 60. By the fourth embodiment, if there are something in the range of the slit 20, the emitter 50 and receiver 60 will produce a signal to a main controller (not shown in FIG. 4) and stop the seal plate 35 to avoid the wafer bumped.

Figure 7:
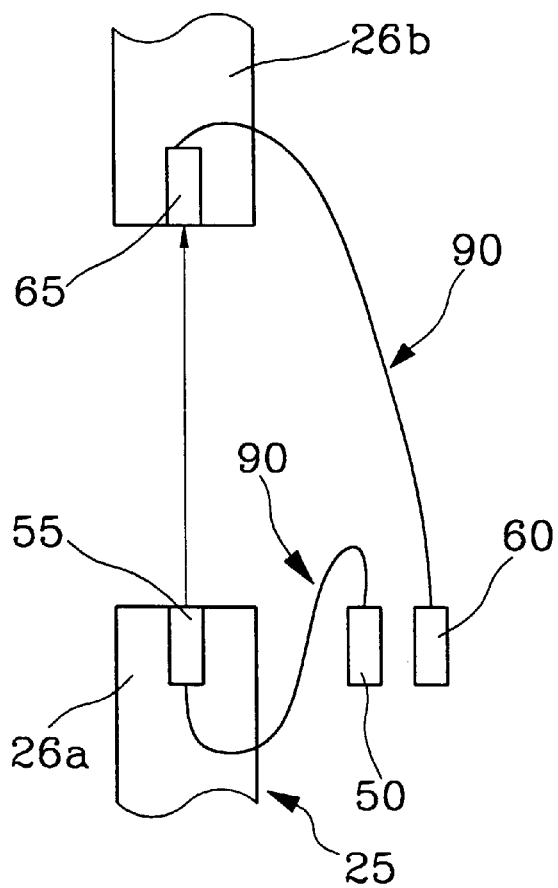
FIG. 7 is a schematic illustration of the fifth embodiment according to the present invention.

FIG. 7 is the fifth embodiment according to the present invention. The main difference between FIG. 5 and FIG. 7 is that FIG. 7shows the emitter 50 separated into an emitted terminus 55 with the emitter 50, further, the receiver 60 separated into an received end 65 with the receiver 60. The emitted terminus 55 is mounted on the edge 26a of the slit valve 25 and the received end 65 is mounted on the other edge 26b of the slit valve 25. We must point out the relationship of the emitted terminus 55 with the emitter 50, the emitted terminus 55 is an end of the emitter 50 to emit light signal and the emitter 50 is a main circuit board processing or transferring the emitted signal. Further, the received end 65 is only used to receive the signal from the emitted terminus 55, then output a signal coupled to the receiver 60. The receiver 60 further process or transfers the signal from the received end 65 into an electronic signal of another type. Furthermore, there are two fibers 90 used to connect the emitted terminus 55 with the emitter 50, also to connect the received end 65 with the receiver 60 to transmit the emitted and the received signal. So the user can place the emitter 50 and the receiver 60 on the other adding device (not shown in FIG. 7) from away the slit valve 25. It would be an embodiment with convenience and flexible by the fifth embodiment in FIG. 7.

Figure 8:
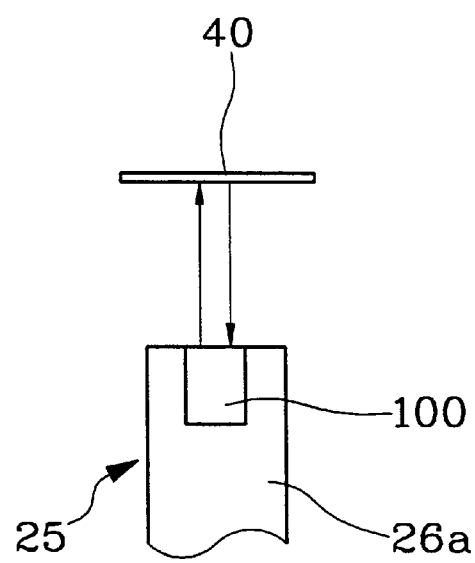
FIG. 8 a schematic illustration of the sixth embodiment according to the present invention.

FIG. 8 is the sixth embodiment with different type of sensor. It mainly uses a approximate switch 100 to sense that whether there are something in the range of seal plate moving. The seal plate is devised in the slit valve 25, not shown in FIG. 8. The approximate switch 100 is mounted on the edge 26a of the slit valve 25 to detect the wafer 40 in the range or not. The main character of the sixth embodiment is to provide the user to equip only one side sensor for slit valve. It also be an embodiment of this invention with convenience and flexible.

The first through the fifth embodiment described above can be used by the different transmitting medium, for example, the light, the infrared rays, the ultra sonic or magnetic sense. So the emitters 50 in FIG. 3 through FIG. 7 are emitting the light signal, the infrared rays or the ultra sonic into the receiver 60 to detect that the moving range of the seal plate invaded something or not. Further, the sixth embodiment shown in FIG. 8 uses the approximate switch 100 to be the sensor. The transmitting medium of the approximate switch 100 is the magnetic sense which detects the wafer and be equipped on only one side. Obviously, the first through the sixth embodiment of the present invention provide the slit valve with safety, convenience and flexible to prevent clipping and avoid the wafer damaged. So we can cost down for the semiconductor production.

While this invention has been described in connection with what is presently considered to be the most practical and preferred embodiment, it is to be understood that the invention is not limited to the disclosed embodiments, but on the contrary, it is intended to cover various modifications and equivalent arrangements included within the spirit and scope of the appended claims.

What is claimed is:

1. A slit valve with safety detect device for reducing a wafer damaged by a seal plate of the slit valve, comprising:

a slit valve used to place a seal plate;

a seal plate sealed up with a slit and placed in the center of the slit valve;

a slit positioned between two different chambers;

a pair of emitters mounted on the two ends of the seal plate to emit signal into a pair of receiver;

a pair of receivers mounted on the two ends of the slit to receive the signal from the pair of emitter;

wherein, when the seal plate is pushed into the chamber through the slit, the emitters emitting the signal to the receivers to detect that whether there are something in the range of the seal plate moving or not, to avoid the wafer damaged by the seal plate to be safety interlock.

2. The slit valve with safety detect device of claim 1, wherein said signal from the emitter to the receiver can be the light, infrared rays and ultra sonic.

3. The slit valve with safety detect device of claim 1, wherein said pair of emitters and the receivers can be replaced by only one emitter mounted on the seal plate and only one receiver mounted on the edge of the slit.

4. The slit valve with safety detect device of claim 1, wherein said pair of emitters and the receivers can be replaced by a approximate switch which mounted on only one side of the slit valve.

5. The slit valve with safety detect device of claim 1, further including a clean dry air devised on the slit valve to push the seal plate moving in/out the slit.

6. A slit valve with safety detect device for reducing a wafer damaged by a seal plate of the slit valve, comprising:

a slit valve separated two parts devised beside a slit;

a seal plate sealed up the slit and placed in the center of one end of the slit valve;

a pair of emitters mounted on the two sides of one end of the slit valve to emit signal into a pair of receiver;

a pair of receivers mounted on the two sides of the other end of the slit valve to receive the signal from the pair of emitter;

wherein, when the seal plate sealed up with the slit, the emitters emitting the signal to the receivers to detect that whether the wafer in the range or not, in order to avoid the wafer damaged by the seal plate to be safety interlock.

7. The slit valve with safety detect device of claim 6, wherein said signal from the emitter to the receiver can be the light, infrared rays and ultra sonic.

8. The slit valve with safety detect device of claim 6, wherein said pair of emitters and the receivers can be replaced by only one emitter mounted on the seal plate and only one receiver mounted on the edge of the slit.

9. The slit valve with safety detect device of claim 6, wherein said pair of the emitters and the receivers can be replaced by a approximate switch which mounted on only one side of the slit valve.

10. The slit valve with safety detect device of claim 8, wherein the only one emitter further connected with an emitted terminus to emit signal, the emitted terminus used only to emit signal not transferring signal.

11. The slit valve with safety detect device of claim 8, wherein the only one receiver further connected with an received end only to receive the signal for the emitted terminus.

12. The slit valve with safety detect device of claim 10, wherein the connected article between the emitter and the emitted terminus is a line of fibers.

13. The slit valve with safety detect device of claim 11, wherein the connected article between the receiver and the received end is a line of fibers.

14. A slit valve with safety detect device for reducing a wafer damaged by a seal plate of the slit valve, comprising:

a slit valve separated two parts devised beside a slit;

an emitter and a receiver mounted on the same side of one part of the slit valve;

a reflector mounted on the other part of the slit valve to reflect the signal from the emitter back to the receiver, to detect something in a moving range of the seal plate.

15. The slit valve with safety detect device of claim 14, wherein said signal from the emitter to the reflector and back to the receiver can be the light, infrared rays and ultra sonic.

* * * * *